United States Patent
Bae

(10) Patent No.: US 7,495,587 B2
(45) Date of Patent: Feb. 24, 2009

(54) LOW POWER BALANCE CODE USING DATA BUS INVERSION

(75) Inventor: Seung-Jun Bae, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/730,795

(22) Filed: Apr. 4, 2007

(65) Prior Publication Data
US 2007/0242508 A1    Oct. 18, 2007

(30) Foreign Application Priority Data
Apr. 4, 2006    (KR)    ...................... 10-2006-0030751

(51) Int. Cl.
*H03M 5/00*    (2006.01)
(52) U.S. Cl. .......................................... 341/55; 341/50
(58) Field of Classification Search ............. 341/50–80
See application file for complete search history.

(56) References Cited

U.S. PATENT DOCUMENTS

| 6,633,951 | B2 | 10/2003 | Cohen |
| 7,221,292 | B2 * | 5/2007 | Hein ........................... 341/55 |

* cited by examiner

*Primary Examiner*—Lam T Mai
(74) *Attorney, Agent, or Firm*—Lee & Morse, P.C.

(57) ABSTRACT

A method and apparatus for reducing power consumption needed to refresh a memory may receive data having been encoded using data bus inversion (DBI), the DBI data having a first delta between a number of zeros for different cases between zero and a DBI maximum, balance code the DBI data to balance the number of zeros across the DBI data, and output data having a number of zeros for different cases between a minimum number greater than zero and less than or equal to the DBI maximum and a maximum number equal to the minimum number plus a second delta, the second delta being less than the first delta.

20 Claims, 12 Drawing Sheets

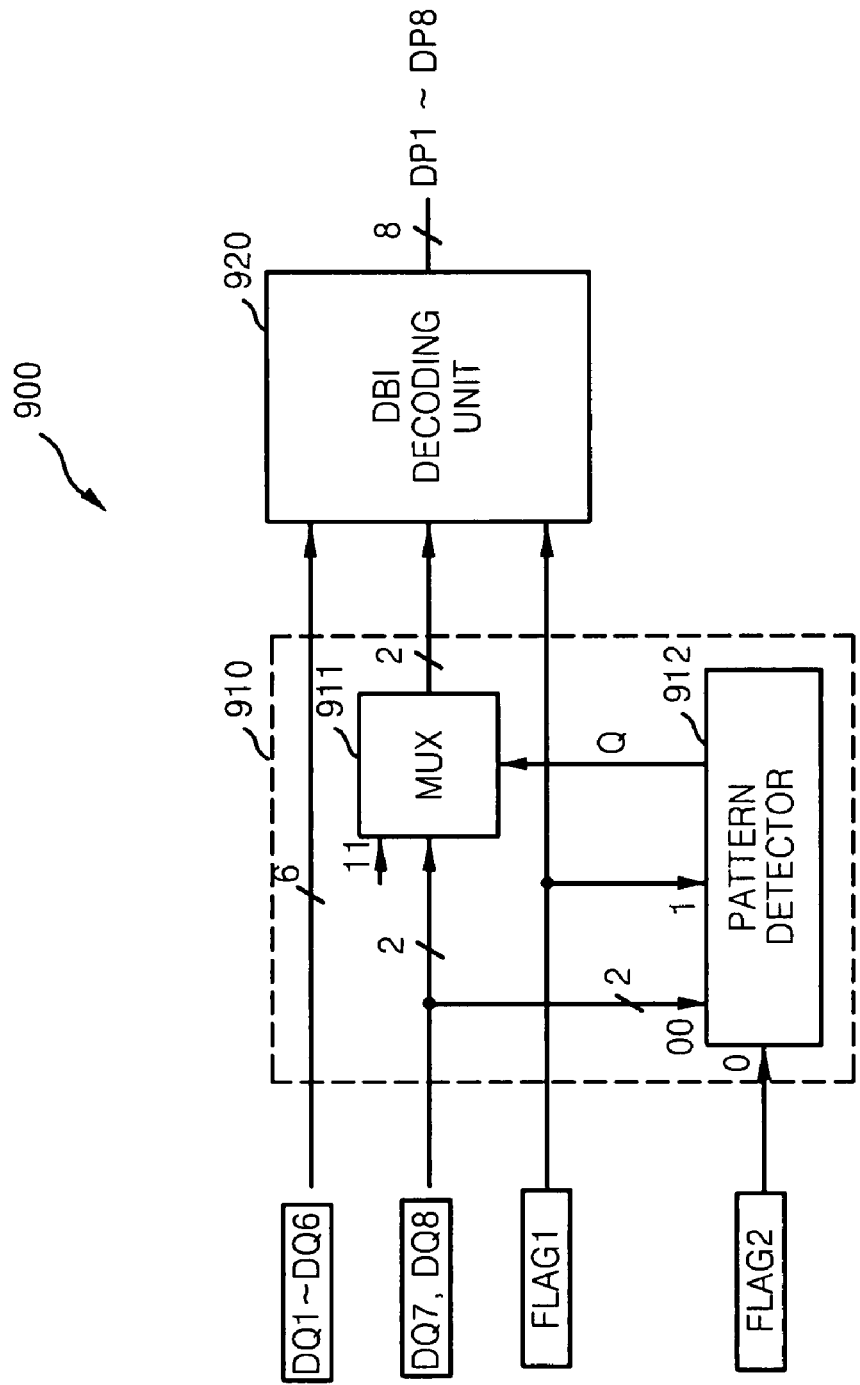

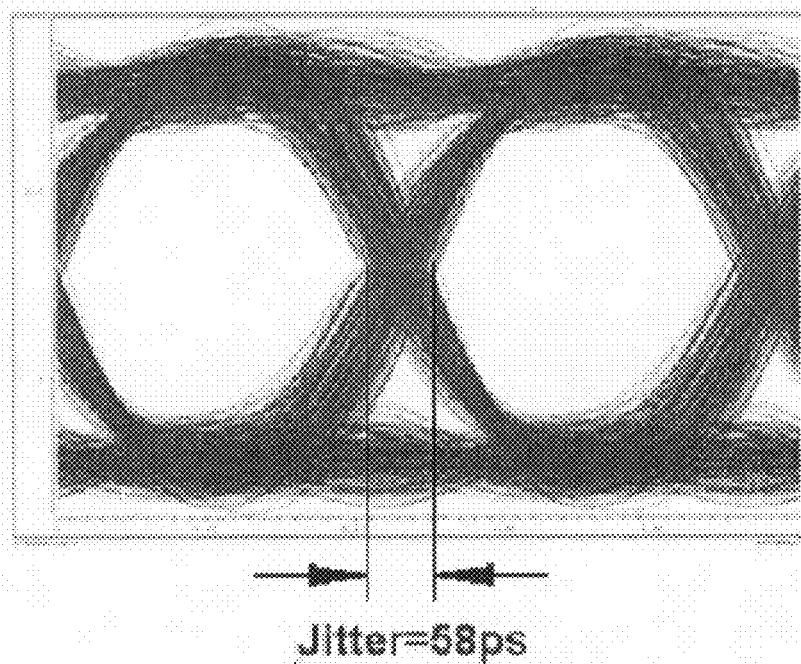

LOW POWER BALANCE CODE USING DATA BUS INVERSION

BACKGROUND OF THE INVENTION

1. Field of the Invention

The present invention relates to a method and apparatus for reducing power needed to refresh a memory. More particularly, the present invention relates to a method and apparatus for balancing coding used during refresh of a memory.

2. Description of Related Art

An interface system basically includes a transmitter that converts information into a signal, a transmission medium over which the signal is transmitted, and a receiver that receives and converts the signal back into usable information. Typically, drivers used in interface systems are inverter-type, i.e., when data is "1", there is no current path, and when data is "0", there is a current path through the transmission medium. Thus, according to the data level, the total current consumption of the drivers may vary, which may result in simultaneous switching noise (SSN).

Further, parasitic inductance between voltage sources of the interface system may cause noise, e.g. jitter, and may reduce the voltage margin or time margin of the data signal. Finally, other noise may degrade data frequency and system performance.

There are numerous coding techniques that may be used to provide fast, high quality, i.e., reduced noise, transmission. Different coding techniques may provide different tradeoffs, e.g., deployment, overhead, transition density and DC balance, alignment, error (protection, detection, replications), and complexity (gate count).

One widely used coding technique is 8B/10B, which provides efficient transitions to guarantee proper DC balance, by ensuring that there are an equal number of ones and zeros in a stream, ease of alignment (finding where the byte starts in a bit stream), robustness (tolerance to errors), and low design complexity. The 8B/10B coding method maps 8B symbols to 10B symbols. All codes used in 8B/10B have from 3 to 10 transitions. Each code word never generates more than four ones or zeros in a row or creates an imbalance greater than one. Using these properties, each character is assigned two mappings (the code and the inverse of the code), and the transmit process may select the appropriate code (±) to keep the running disparity between ±1. This means that there are just as many "1"s as "0"s in a string of two symbols, and that there are not too many "1"s or "0"s in a row. This is an important attribute for a signal that needs to be sent at high rates because it helps reduce intersymbol interference.

All of these features have made 8B/10B the most widely used coding method. However, 8B/10B has a large overhead of 25%, i.e., a symbol rate that is 25% greater than a data rate, a high coding complexity, and a large layout area. Further, as demand for faster computing devices has increased, frequencies at which these devices operate have increased. These higher frequencies demand more power. Most computing systems use dynamic memories, which may require periodic refreshing in order to maintain data stored therein. Typically, the more ones multi-bit data has, the more power is required to refresh the multi-bit data.

A data bus inversion (DBI) method, illustrated in FIG. 9, may be used to reduce coding complexity, layout area and power consumption of the 8B/10B method.

In particular, the DBI method may include receiving multi-bit data, e.g., eight-bit data, in step S910 and counting a number of ones and zeros in the multi-bit data in step S920. Then, whether a number of zeros exceeds a predetermined value k, e.g., four for eight-bit data, may be determined in step S930. If the predetermined value k is exceeded, the data word may be inverted and a flag may be set to a first value, e.g., one, in step S940. If the predetermined value k is not exceeded, the data word may be maintained and the flag may be set to a second value, e.g., zero, in step S950. The data may then be decoded in accordance with the value of the flag. The flag serves as the inversion indicator.

However, even using the DBI method, a number of data "0" may be between zero and four. Therefore, the maximum current consumption may still be 4*IDQ (quiescent current), where 1*IDQ refers to an amount of current consumption per one DQ.

SUMMARY OF THE INVENTION

The present invention is therefore directed to a method and apparatus, which substantially overcome one or more of the problems due to the limitations and disadvantages of the related art.

It is therefore a feature of an embodiment of the present invention to provide a method and apparatus that reduces power consumption needed to refresh a memory.

It is therefore another feature of an embodiment of the present invention to provide a method and apparatus that reduces noise during refresh of a memory.

It is therefore another feature of an embodiment of the present invention to provide a method and apparatus that balances coding using during refresh of a memory.

At least one of the above and other features and advantages of the present invention may be realized by providing a method, including receiving data having been encoded using data bus inversion (DBI), the DBI data having a first delta between a number of zeros for different cases between zero and a DBI maximum, balance coding the DBI data to balance the number of zeros across the DBI data, and outputting data having a number of zeros for different cases between a minimum number greater than zero and less than or equal to the DBI maximum and a maximum number equal to the minimum number plus a second delta, the second delta being less than the first delta.

The second delta may be half the first delta. The balance coding may be repeated n times and the second delta is greater than or equal to the first delta divided by $2^n$.

The balance coding may include, for each case, counting a number of data "0" in DBI data, including multi-bit data and an inversion indicator, comparing the number of data "0" with the minimum number, setting a flag to "1" when the number is greater than or equal to the minimum number, and outputting the flag and the DBI data as encoded data, setting the flag to "0" when the number is less than the minimum number, comparing the number of data "0" plus one to the minimum number, when the number of data "0" plus one is greater than or equal to the minimum number, outputting the flag and the DBI data as encoded data, and when the number of data "0" plus one is less than the minimum number, altering values of at least two least significant bits in the multi-bit data, outputting the inversion indicator, the flag and the altered multi-bit data as encoded data.

The altering may include inverting the at least two least significant bits. The altering may include setting the at least two least significant bits to zero.

The at least two least significant bits to be altered may be less than half of a number of bits of the multi-bit data and greater than or equal to a quarter of the number of bits of the multi-bit data. The balance coding may be repeated n times. The at least two least significant bits to be altered may be less than a number of bits of the multi-bit data divided by $2^n$ and greater than or equal to the number of bits of the multi-bit data divided by $2^{n+1}$.

The outputting may include storing the encoded data in a memory. The method may include reading encoded data stored in the memory, and restoring the at least two least significant bits in accordance with a value of the inversion indicator, a value of the flag and values of the at least two least significant bits. The method may include inverting the multi-bit data in accordance with the inversion indicator.

At least one of the above and other features and advantages of the present invention may be realized by providing a system, including a balancing unit having a logic level detector receiving data bus inverted (DBI) data including multi-bit data and an inversion indicator, the logic level detector outputting a flag, the flag being a first value when a number of data "0" in the DBI data is less than a minimum number of data "0", the minimum number being greater than zero and less than or equal to a DBI maximum number of zeros, and being a second value when the number of data "0" in the DBI data is greater than or equal to the minimum number, the logic level detector further outputting a trigger signal when the number of data "0" plus one is less than the minimum number, and a multiplexer receiving at least two least significant bits of the multi-bit data and the trigger signal from the logic level detector, the multiplexer altering the at least two least significant bits in response to the trigger signal, otherwise outputting the least significant bits unchanged, the balancing unit further outputting multi-bit data other than the least significant bits unchanged, the inversion indicator and the flag.

The multiplexer may invert the at least two significant bits or may set the at least two significant bits to zero.

The balancing unit may be employed n times, a number of least significant bits changed being less than a number of bits of the multi-bit data divided by $2^n$ and greater than or equal to the number of bits of the multi-bit data divided by $2^{n+1}$.

The system may include a memory for storing outputs from the balancing unit. The system may include a balance reversing unit receiving the inversion indicator, the flag, multiple bit data other than the least significant bits and the least significant bits, the balance reversing unit restoring the least significant bits in accordance with a value of the inversion indicator, a value of the flag and values of the at least two least significant bits value of the multi-bit data, otherwise outputting the least significant bits unchanged.

The system may include a balance reversing unit including a pattern detector receiving the inversion indicator, the at least two least significant bits and the flag, and outputting a trigger signal when a pattern of the flag, the inversion indicator and the at least two least significant bits indicates the least significant bits have been changed, and a multiplexer receiving the least significant bits and the trigger signal, the multiplexer of the balance reversing unit restoring the least significant bits in response to the trigger signal, otherwise outputting the least significant bits unchanged, balance reversing unit further outputting the inversion indicator and multi-bit data other than the least significant bits. The system may include a decoding unit receiving the inversion indicator and the multi-bit data, and restoring the multi-bit data.

At least one of the above and other features and advantages of the present invention may be realized by providing a machine-readable medium that provides executable instructions, which, when executed by a processor, cause the processor to perform any of the method discussed above

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 6A illustrates a block diagram of the decoding unit in FIG. 4 in accordance with an embodiment of the present invention;

FIGS. 7A and 7B illustrate eye diagrams using no coding and using the coding in accordance with an embodiment of the present invention;

DETAILED DESCRIPTION OF THE INVENTION

Figure 1:
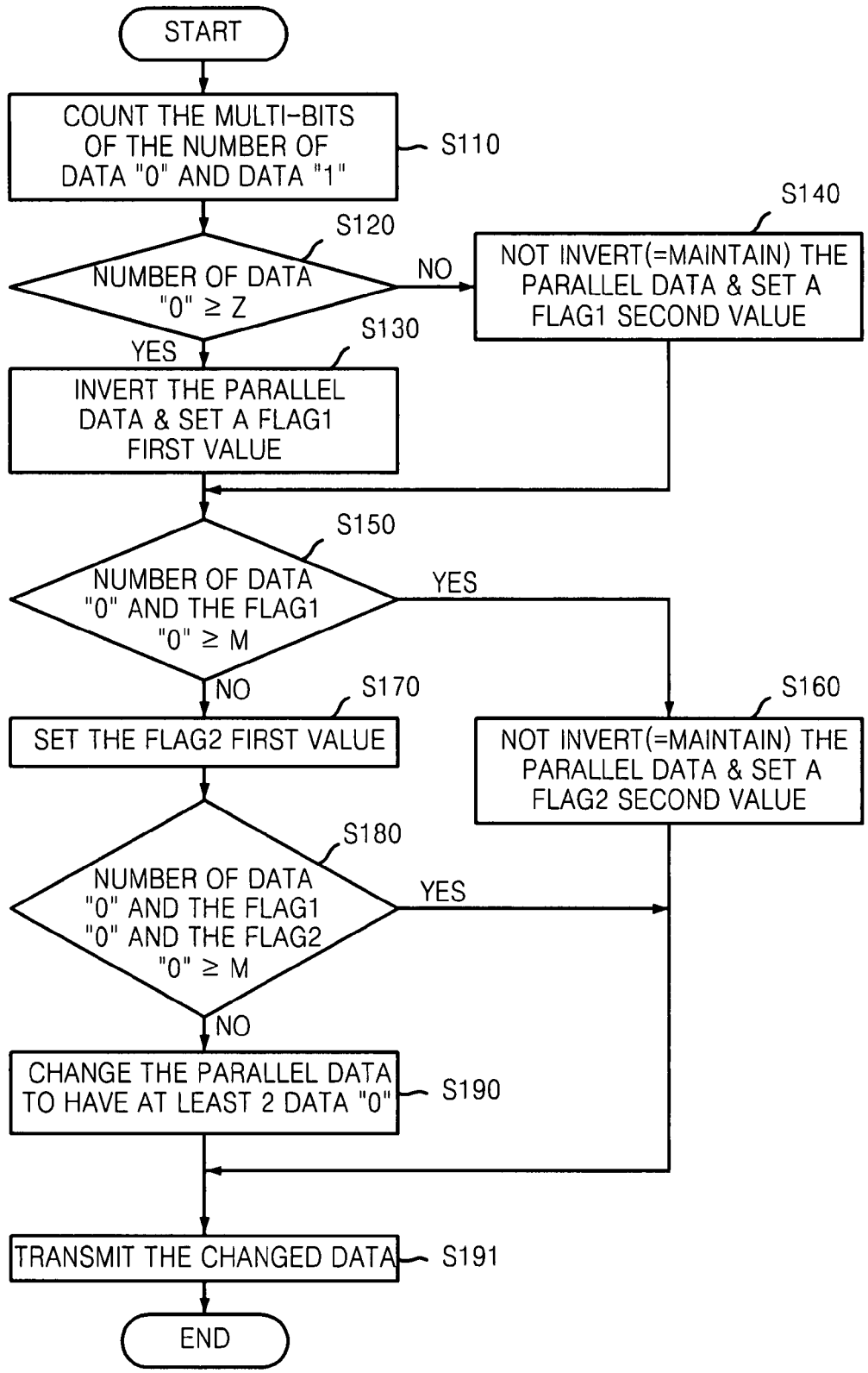
FIG. 1 illustrates a flowchart of an encoding process in accordance with an embodiment of the present invention.

This application claims priority under 35 USC §119 to Korean Patent Application No. 10-2006-0030751, filed on Apr. 4, 2006 in the Korean Intellectual Property Office, the disclosure of which is incorporated herein in its entirety by reference.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

A coding method in accordance with embodiments of the present invention may use two or more flags, i.e., one or more flags in addition to an inversion indicator, to further reduce current consumption and/or noise.

FIG. 1 illustrates a flowchart of an encoding method in accordance with an embodiment of the present invention. First, a number of data "0" in the multi-bit data may be counted in step S110. Then, this number may be compared to a predetermined value Z in step S120. The predetermined value Z may be equal to or greater than half a number of bits in the multi-bit data. If the predetermined value Z is exceeded, the multi-bit data may be inverted and a first flag Flag1 may be set to a first value, e.g., one, in step S130. If the predetermined value Z is not exceeded, the multi-bit data may be maintained and the first flag Flag1 may be set to a second value, e.g., zero, in step S140. Again, the first flag Flag1 serves as the inversion indicator.

Then, in step S150, a sum of the number of "0" data counted in step S110 and the value of the first flag Flag1 may be compared to a predetermined value M. The predetermined value M may be equal to the predetermined value Z.

If the sum is less than M, then a second flag Flag2 may be set to a first value, e.g., zero, in step S170. Then, in step S180, a sum of the number of "0" data counted in step S110, the value of the first flag Flag1 and the value of the second flag Flag2 may be compared to the predetermined value M. If the sum is greater than or equal to M, then the multi-bit data may be maintained, and the method may proceed to step 191, which may transmit the data. If the sum is less than M, then at least two bits of the multi-bit data may be changed to zero. For example, up to half a number of bits in the multi-bit data may be changed to zero. Then, the method may proceed to step 191, which may transmit the data.

If the sum is greater than or equal to M, then the multi-bit data may be maintained and the second flag Flag2 may be set to a second value, e.g., one, in step S160. The method may then proceed to step 191, which may transmit the data.

Figure 2:
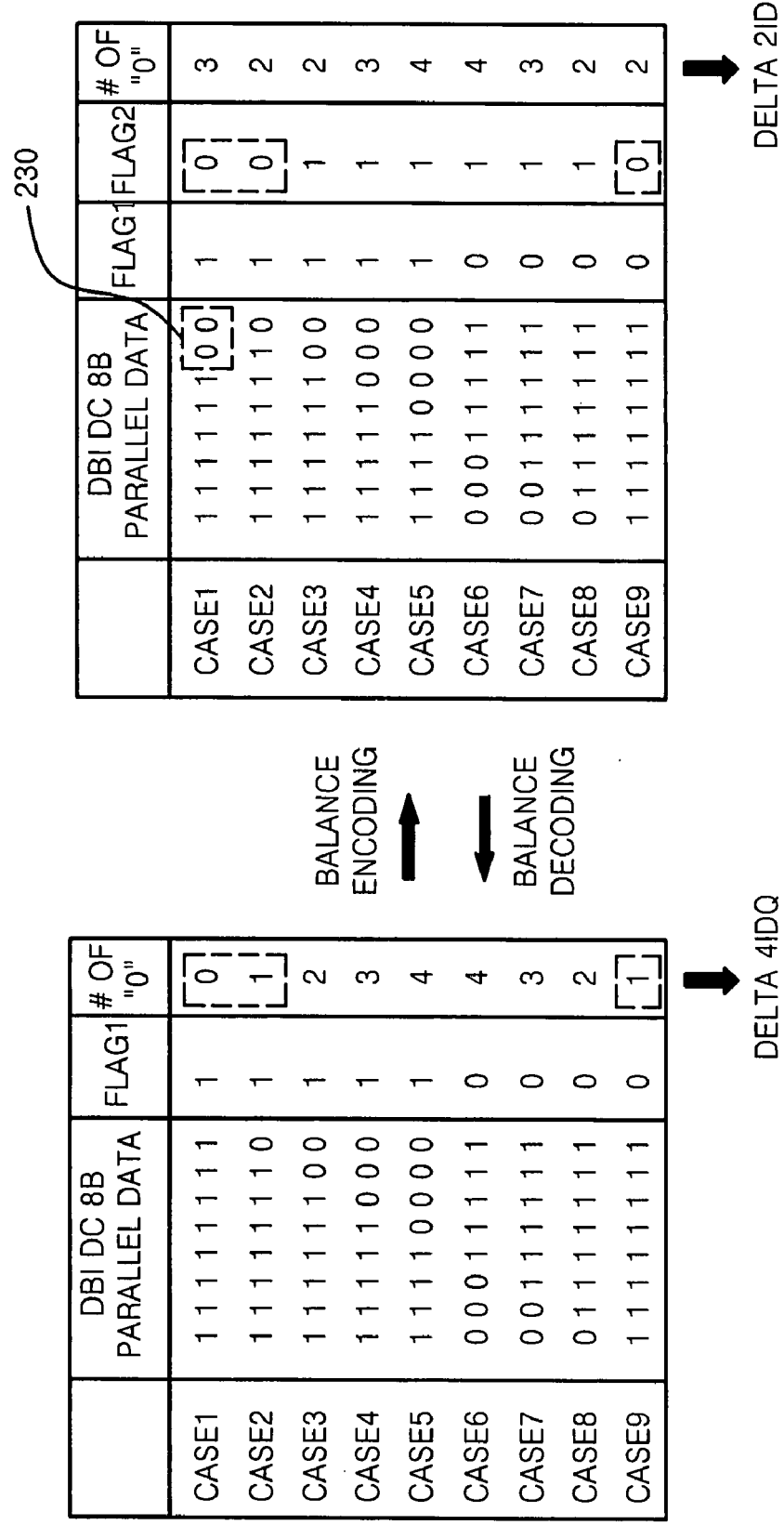
FIG. 2 illustrates a coding table in accordance with an embodiment of the present invention.

FIG. 2 illustrates a coding table for eight-bit data in accordance with an embodiment of the present invention. As can be seen therein, the multi-bit data, here 8-bit data, may first be subjected to the DBI method such that the number of zeros in the encoded data may range between zero and at least half of the number of multi-bits, e.g., four. Then, the DBI coded data may be subjected to steps S150 to S190 of FIG. 1 to reduce a difference in range of number of zeros among the multi-bit data, thereby reducing noise. In particular, a number of zeros in CASE1 to CASE5 exceed the predetermined number Z, so the multi-bit data may be inverted, and the first flag Flag1 may be set to a first value, e.g., one. In contrast, a number of zeros in CASE6 to CASE9 do not exceed the predetermined number Z, so the multi-bit data may be maintained, and the first flag Flag1 may be set to a second value, e.g., zero.

As can be seen, for example, in FIG. 2, during balance encoding, for those cases having less than a middle number with the range of number of zeros after the DBI encoding, e.g., two, here CASE1, CASE2 and CASE9, the second flag Flag2 may be set to a first value, e.g., zero. For all other cases, the second flag Flag2 may be set to be a second value, e.g., one. Note that the first and second values for the first flag Flag1 and the second flag Flag2 may not be the same.

If a total number of zeros for a case still is less than the middle number, e.g., CASE1, a number of least significant bits, e.g., the final two bits, of the data may be set to zero, as indicated by 2B data 230. Therefore, the number of zeros now may range between two and four. Thus, the code may be balanced, i.e., a delta between different cases may be reduced, reducing noise. In this particular example, the delta may be reduced from 4IDQ to 2IDQ.

Figure 3:
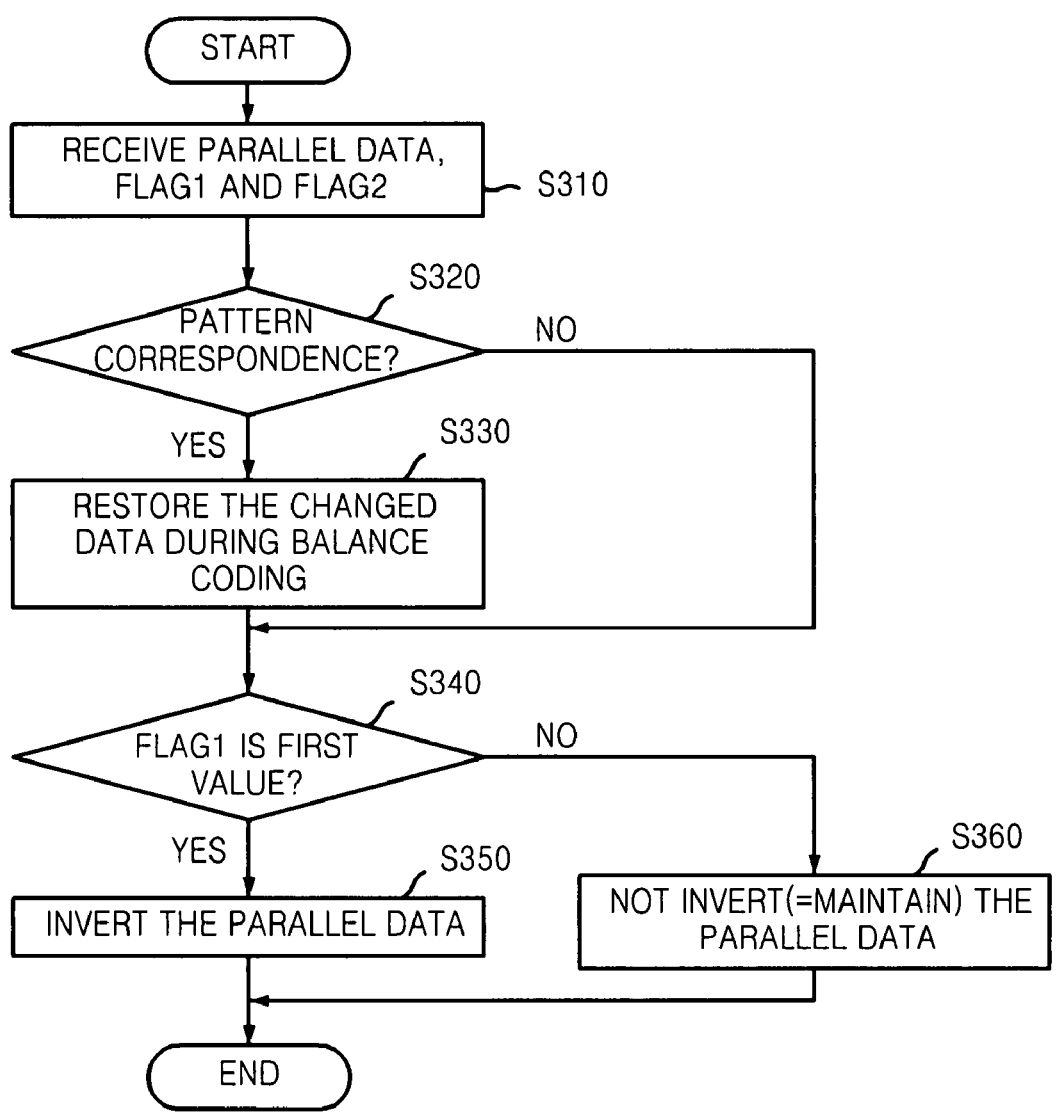
FIG. 3 illustrates a flowchart of an encoding process in accordance with an embodiment of the present invention.

FIG. 3 illustrates a flowchart for decoding multi-bit data in accordance with an embodiment of the present invention. In step S310, the encoded multi-bit data, the first flag Flag1 and the second flag Flag2 may be received. In step S320, pattern correspondence may be determined, i.e., the value of the second flag Flag2 and the number of zeros may be checked. If the second flag Flag2 is zero and the number of zeros is greater than M, the zeros in the coded multi-bit data may be restored to ones before proceeding to step S340. Otherwise, the process may proceed to step S340. A value of the first flag Flag1 may be determined. If the first flag Flag1 is one, the multi-bit data may be inverted in step S340. Otherwise, the multi-bit data may be maintained in step S360.

Figure 4:
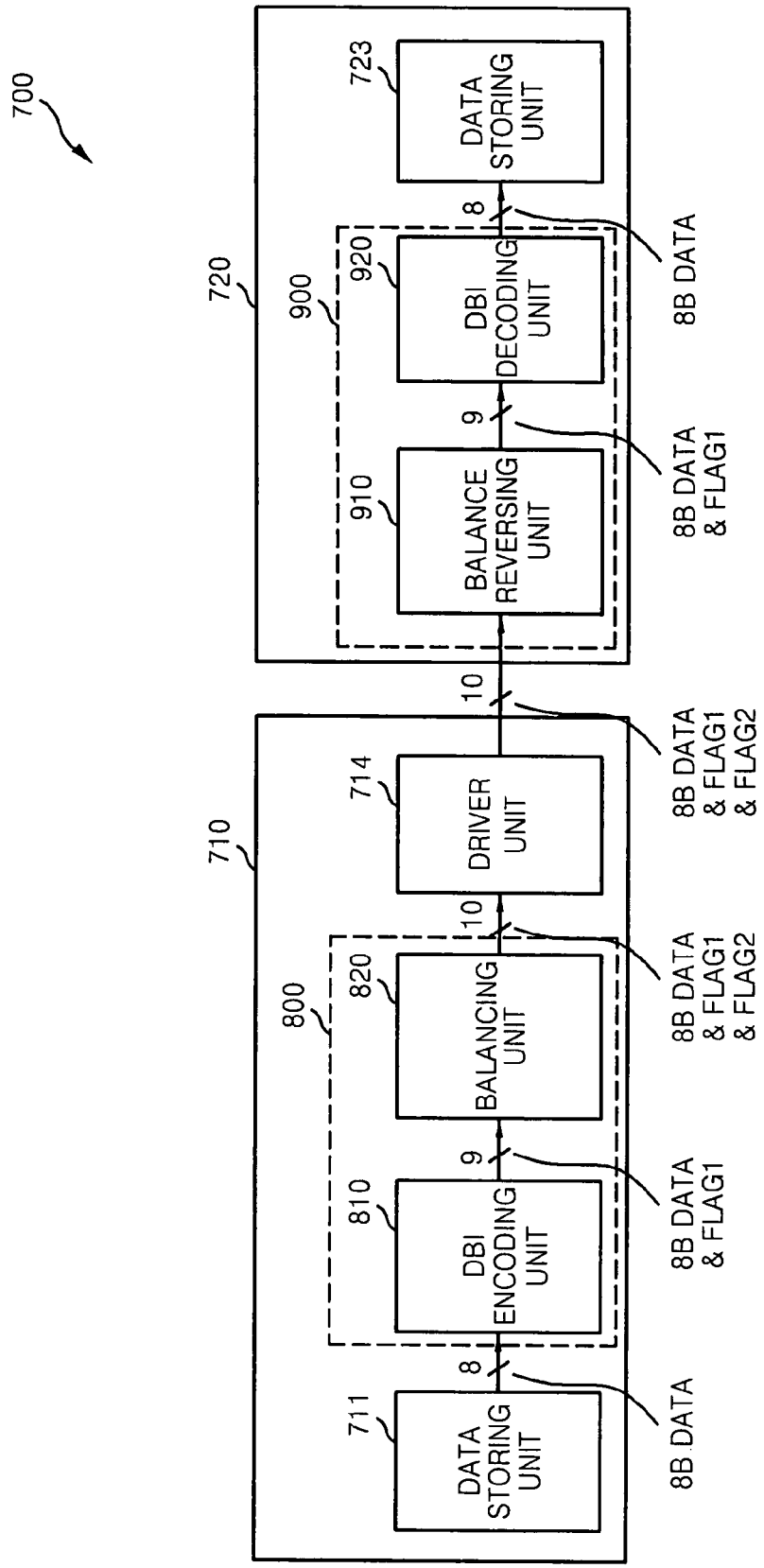
FIG. 4 illustrates a block diagram of a single-ended parallel data interface system in accordance with an embodiment of the present invention.

FIG. 4 illustrates a block diagram of a single-ended parallel data interface system 700. The system 700 may include a transmitter 710 and a receiver 720.

The transmitter 710 may include a data storing unit 711, an encoding unit 800 and a driver unit 714. The encoding unit 800 may include a DBI encoding unit 810 and a balancing unit 820. Details of the encoding unit 800 will be described in detail below with reference to FIGS. 5A and 5B.

The receiver 720 may include a decoding unit 900 and a data storing unit 723. The decoding unit 900 may include a balance reversing unit 910 and a DBI decoding unit 920. Details of the decoding unit 900 will be described in detail below with reference to FIGS. 6A and 6B.

Figure 5A:
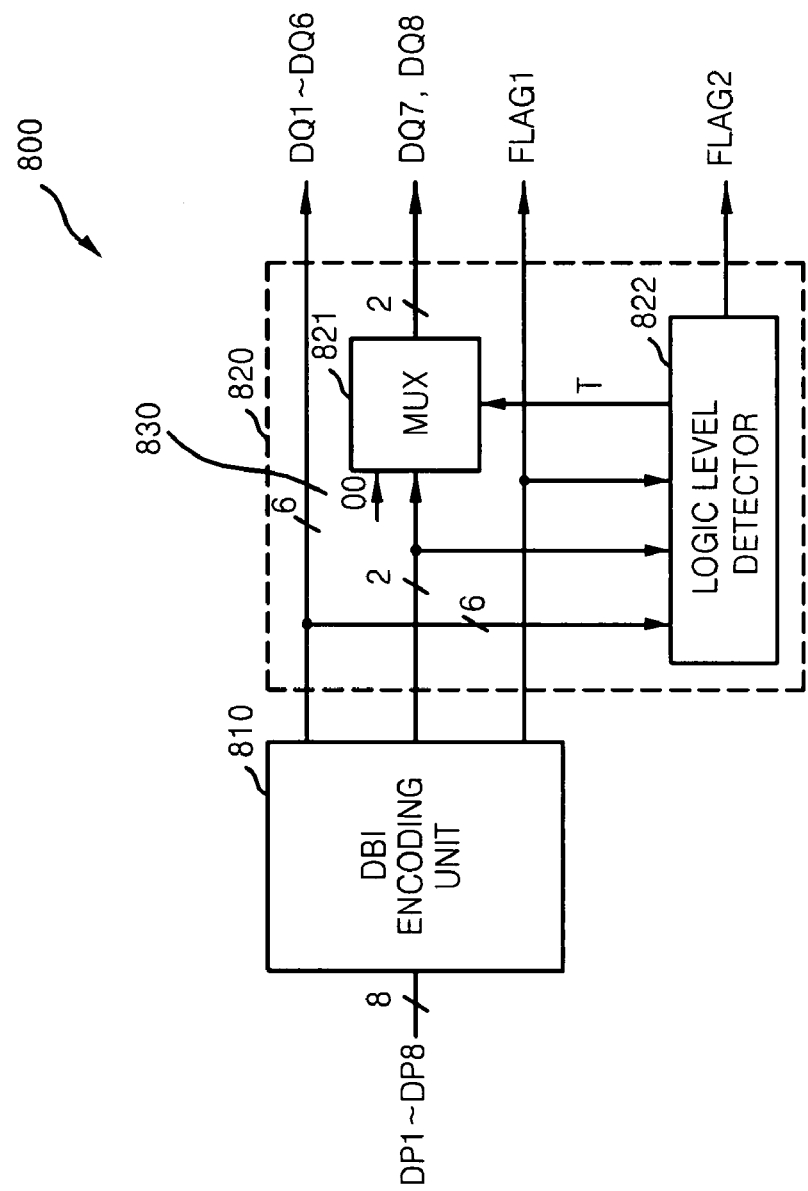
FIG. 5A illustrates a block diagram of the encoding unit in FIG. 4 in accordance with an embodiment of the present invention.
Figure 5B:
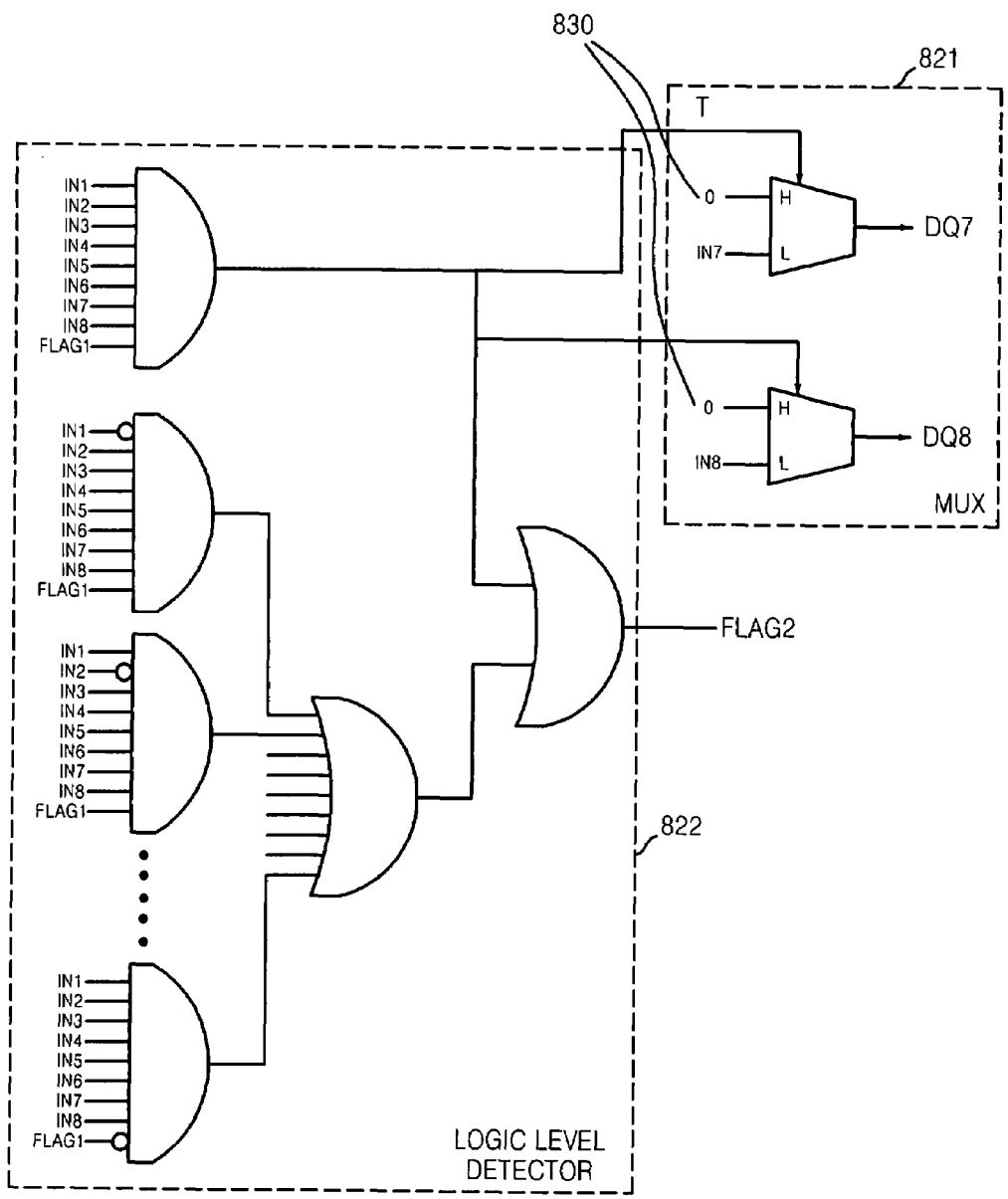
FIG. 5B illustrates a schematic diagram of the encoding unit in FIG. 5A in accordance with an embodiment of the present invention.

FIG. 5A illustrates a block diagram of the encoding unit 800, and FIG. 5B illustrates a schematic diagram of the encoding unit 800, including the DBI encoding unit 810 and the balancing unit 820. The balancing unit 820 may include a multiplexer (MUX) 821 and a logic level detector 822. For example, for each eight bits of data 8B, the first 6B of the 8B data may be output to the logic level detector 822, and may otherwise pass through the balancing unit 820 without any further processing as DQ1 to DQ6. The final 2B of the 8B data may also be output to the logic level detector 822 and to the MUX 821. The first flag Flag1 may also be output to the logic level detector 822, and may otherwise pass through the balancing unit 820 without any further processing. The MUX 821 also may receive the 2B data 830 externally and a trigger T from the logic level detector 822. The trigger T may be determined in accordance with the number of zeros in the 8B data and the first flag Flag1. The MUX 821 may then output DQ7 and DQ8, and the logic level detector 822 may output the second flag Flag2.

As may be seen in FIG. 5B, the logic level detector 822 may include a plurality of AND gates and two OR gates, and the MUX 821 may include a pair of multiplexers. In particular, each bit of the multi-bit data and the first flag Flag1 may be subjected to an AND operation, the result of which may be output as the trigger T to the MUX 821. When the trigger T is one, the input data IN7, IN8 may be maintained and output as the output data DQ7, DQ8. When the trigger T is zero, the output data DQ7, DQ8 may be output as zero.

The trigger T may also be output to a final one of the OR gates. Remaining AND gates may output a result of subjecting the multi-bit data having sequential inputs individually inverted to an AND operation to an initial one of the OR gates. The initial OR gate may output a result thereof to the final OR gate, which, in turn, may output the second flag Flag2.

Figure 6B:
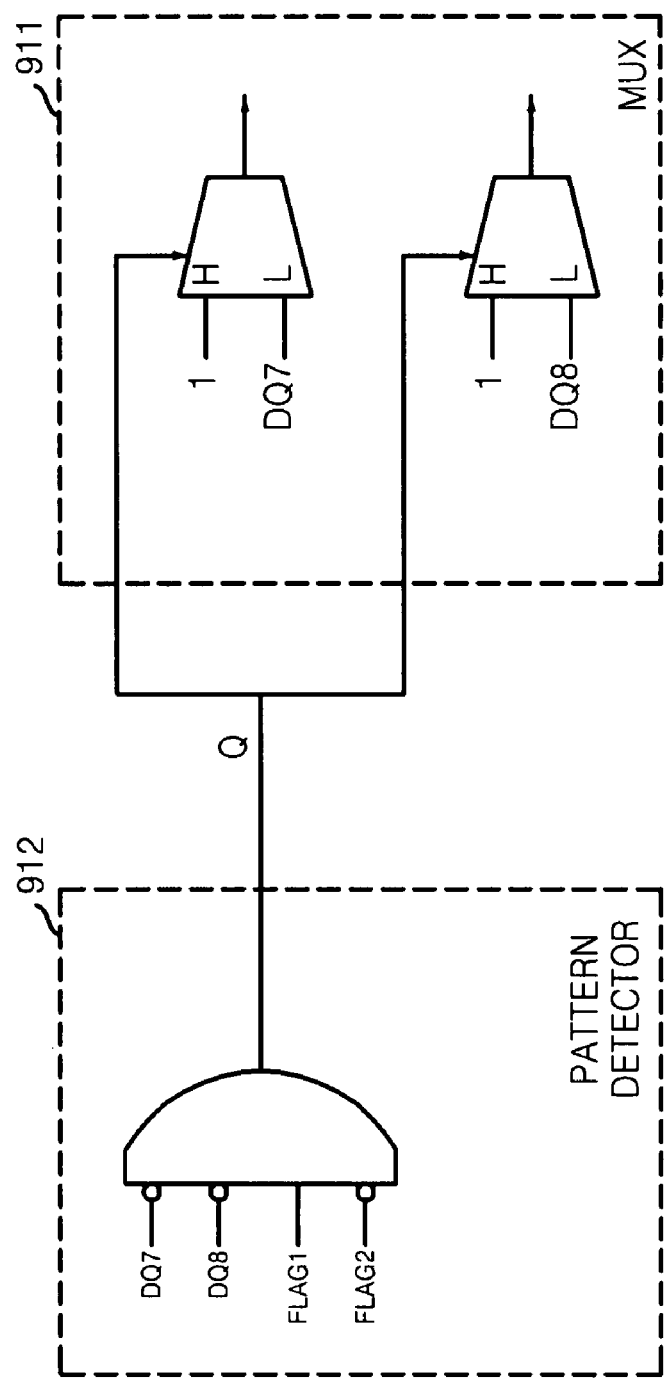
FIG. 6B illustrates a schematic diagram of the decoding unit in FIG. 6A in accordance with an embodiment of the present invention.

FIG. 6A illustrates a block diagram of the decoding unit 900, and FIG. 6B illustrates a schematic diagram of the decoding unit 900, including the balance reversing unit 910 and the DBI decoding unit 920. The balance reversing unit 910 may include a MUX 911 and a pattern detector 912.

The first 6B of the 8B data may pass through the balance reversing unit 910 without any further processing to the DBI decoding unit 920. The final 2B of the 8B data may be output to the pattern detector 912 and to the MUX 911. The first flag Flag1 may also be output to the pattern detector 912, and may otherwise pass through the balance reversing unit 910 without any further processing. The MUX 911 also may receive 2B data "11" externally and a trigger Q from the pattern detector 912. The trigger Q may be determined in accordance with the final 2B data of the 8B data, the first flag Flag1 and the second flag Flag2. The MUX 911 may then output the final 2B data accordingly to the DBI decoding unit 920.

As may be seen in FIG. 6A, the pattern detector 912 may include an AND gate receiving the first flag Flag1, inverted inputs of DQ7, DQ8, and the second flag Flag2, the result of which may be output as the trigger Q to the MUX 911. When the trigger Q is one, the output data DQ7, DQ8 may be restored to ones. When the trigger Q is zero, the output data DQ7, DQ8 may be maintained.

Figure 7B:
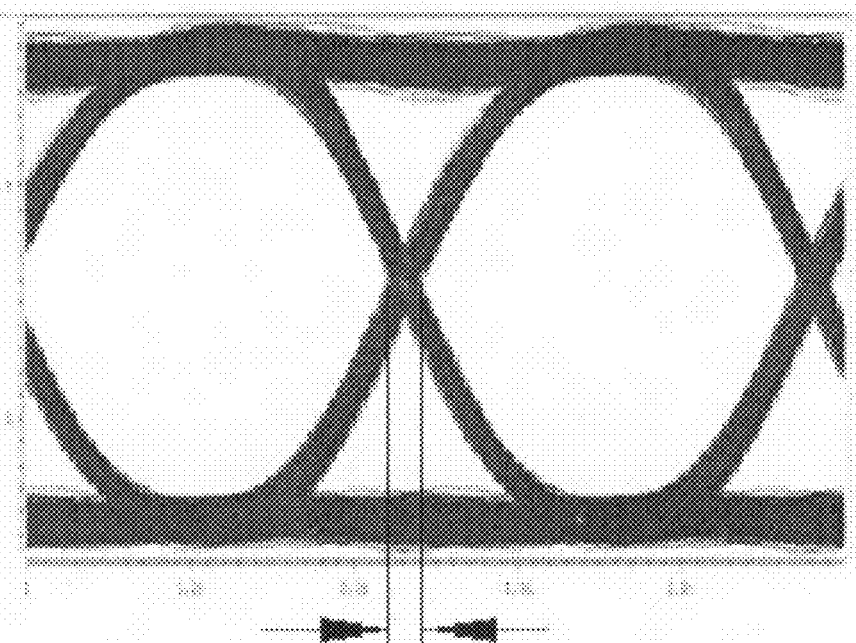

FIGS. 7A and 7B illustrate eye diagrams for a signal having no coding and a signal coded in accordance with an embodiment of the present invention, respectively. As can be seen therein, coding in accordance with the present invention may significantly reduce jitter, e.g., by more than half.

Figure 8:
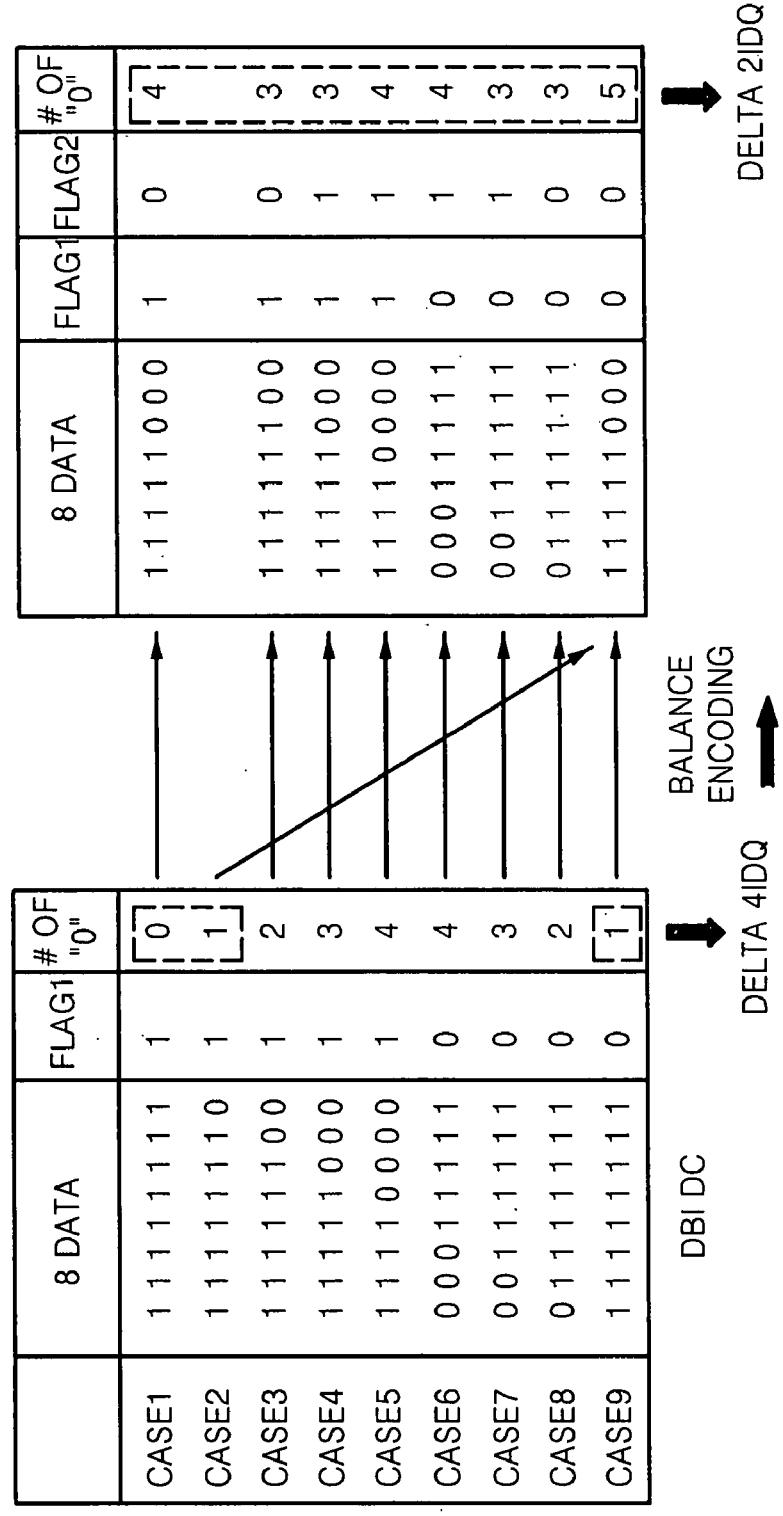
FIG. 8 illustrates a coding table in accordance with an embodiment of the present invention.
Figure 9:
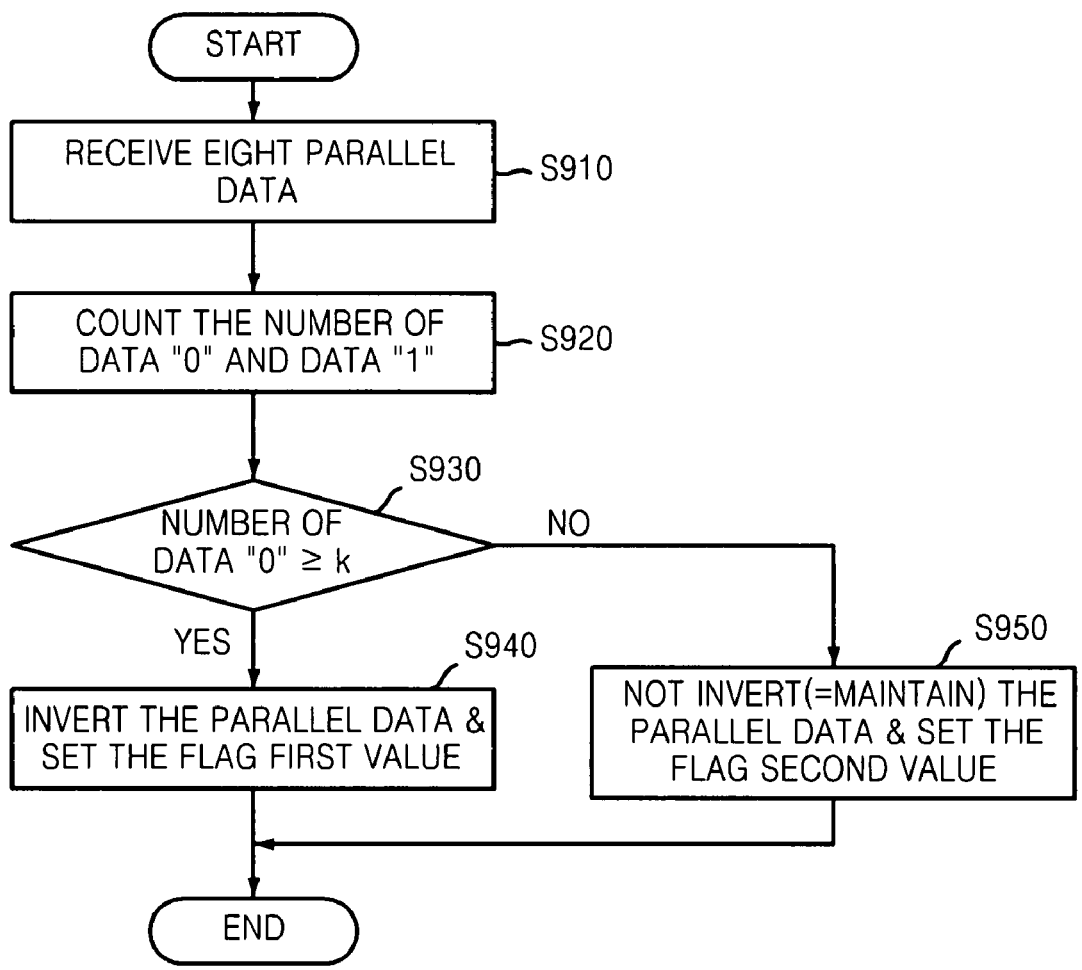
FIG. 9 illustrates a flowchart of a conventional encoding method.

FIG. 8 illustrates a coding table for eight-bit data in accordance with another embodiment of the present invention. As can be seen therein, the multi-bit data, here 8-bit data, may first be subjected to the DBI method such that the number of zeros in the encoded data ranges between zero and at least half of the number of multi-bits. Then, the DBI coded data may be subjected to steps S150 to S180 of FIG. 1 to reduce a difference in range of number of zeros among the multi-bit data, thereby reducing noise. However, rather than forcing the least significant bits, here the final three bits, of the multi-bit data to be zero when there are insufficient zeros present, the least significant bits may be inverted.

As can be seen, for example, in FIG. 8, for those cases having less than or equal to a middle number within the range of number of zeros, e.g., two, here CASE1, CASE2, CASE3, CASE8 and CASE9, the second flag Flag2 may be set to be zero. For all other cases, the second flag Flag2 may be set to be one. If the number of zeros is still less than or equal to the middle number, e.g., CASE1, CASE2 and CASE9, the final three bits of the data may inverted. Therefore, the number of zeros now may range between three and five. Thus, a delta between different cases is reduced, reducing noise. In this particular example, the delta is reduced from 4IDQ to 2IDQ.

While the least significant bits are illustrated as being set to "0" in the encoding in accordance with embodiments of the present invention, any of the bits of the data of the desired number may be set to "zero" in accordance with the present invention. In other words, the encoding of the present invention is concerned with a total number of zeros for each case, and each case may represent more than one data value.

While embodiments of the present invention have been described in connection with a multi-bit data that is an eight-bit word for ease of description, the balance coding in accordance with embodiments of the present invention may be extended to other multi-bit data, e.g., 16-bit data, 64-bit data, etc. Further, while only one balance coding has been illustrated for ease of description, repeated balance codings may be employed.

For example, when n balance codings are used, an initial delta $\Delta_i$ between a maximum number of zeros and a minimum number of zeros in the initial multi-bit data may be reduced by up to $2^{(n+1)}$, where n=0 indicates that only data bus inversion has occurred, i.e., no balance codings have been performed. In other words, after n balance codings, a resultant delta $\Delta_n$ may be satisfy the following relationship (1).

$$\Delta_i > \Delta_n \geq \frac{\Delta_i}{2^{(n+1)}} \quad (1)$$

Additionally, a number of bits x within multi-bit data having m-bits that may be used as the least significant bits to be set to zero or inverted, may satisfy the following relationship (2).

$$\frac{m}{2^n} > x \geq \frac{m}{2^{(n+1)}} \quad (2)$$

Exemplary embodiments of the present invention have been disclosed herein, and although specific terms are employed, they are used and are to be interpreted in a generic and descriptive sense only and not for purpose of limitation. For example, the balancing of multi-bit data of the present invention may be implemented in software, e.g., by an article of manufacture having a machine-accessible medium including data that, when accessed by a machine, cause the machine to balance the multi-bit data in accordance with methods of the present invention. Further, while 8-bit data has been given as an example of multi-bit data, embodiments of the present invention may be adapted to other sizes of multi-bit data. It is noted that each additional flag may reduce a delta between coded data by up to a factor of two. Accordingly, it will be understood by those of ordinary skill in the art that various changes in form and details may be made without departing from the spirit and scope of the present invention as set forth in the following claims.

What is claimed is:

1. A method, comprising:
   receiving data having been encoded using data bus inversion (DBI), the DBI data having a first delta between a number of zeros for different cases between zero and a DBI maximum;
   balance coding the DBI data to balance the number of zeros across the DBI data; and
   outputting data having a number of zeros for different cases between a minimum number greater than zero and less than or equal to the DBI maximum and a maximum number equal to the minimum number plus a second delta, the second delta being less than the first delta.

2. The method as claimed in claim 1, wherein the second delta is half the first delta.

3. The method as claimed in claim 1, wherein the balance coding is repeated n times and the second delta is greater than or equal to the first delta divided by $2^n$.

4. The method as claimed in claim 1, wherein the balance coding comprises, for each case:
   counting a number of data "0" in DBI data, including multi-bit data and an inversion indicator;
   comparing the number of data "0" with the minimum number;
   setting a flag to "1" when the number is greater than or equal to the minimum number, and outputting the flag and the DBI data as encoded data;
   setting the flag to "0" when the number is less than the minimum number;
   comparing the number of data "0" plus one to the minimum number;
   when the number of data "0" plus one is greater than or equal to the minimum number, outputting the flag and the DBI data as encoded data; and
   when the number of data "0" plus one is less than the minimum number, altering values of at least two least significant bits in the multi-bit data, outputting the inversion indicator, the flag and the altered multi-bit data as encoded data.

5. The method as claimed in claim 4, wherein altering includes inverting the at least two least significant bits.

6. The method as claimed in claim 4, wherein altering includes setting the at least two least significant bits to zero.

7. The method as claimed in claim 4, wherein the at least two least significant bits to be altered being less than half of a number of bits of the multi-bit data and greater than or equal to a quarter of the number of bits of the multi-bit data.

8. The method as claimed in claim 4, wherein the balance coding is repeated n times, the at least two least significant bits to be altered being less than a number of bits of the multi-bit data divided by $2^n$ and greater than or equal to the number of bits of the multi-bit data divided by $2^{n+1}$.

9. The method as claimed in claim 4, wherein the outputting includes storing the encoded data in a memory.

10. The method as claimed in claim 9, further comprising:
reading encoded data stored in the memory; and
restoring the at least two least significant bits in accordance with a value of the inversion indicator, a value of the flag and values of the at least two least significant bits.

11. The method as claimed in claim 10, further comprising inverting the multi-bit data in accordance with the inversion indicator.

12. A system, comprising:
a balancing unit including,
a logic level detector receiving data bus inverted (DBI) data including multi-bit data and an inversion indicator, the logic level detector outputting a flag, the flag being a first value when a number of data "0" in the DBI data is less than a minimum number of data "0", the minimum number being greater than zero and less than or equal to a DBI maximum number of zeros, and being a second value when the number of data "0" in the DBI data is greater than or equal to the minimum number, the logic level detector further outputting a trigger signal when the number of data "0" plus one is less than the minimum number; and
a multiplexer receiving at least two least significant bits of the multi-bit data and the trigger signal from the logic level detector, the multiplexer altering the at least two least significant bits in response to the trigger signal, otherwise outputting the least significant bits unchanged, wherein:
the balancing unit further outputs multi-bit data other than the least significant bits unchanged, the inversion indicator and the flag.

13. The system as claimed in claim 12, wherein the multiplexer inverts the at least two least significant bits.

14. The system as claimed in claim 12, wherein the multiplexer sets the at least two least significant bits to zero.

15. The system as claimed in claim 12, wherein the balancing unit is employed n times, a number of least significant bits changed being less than a number of bits of the multi-bit data divided by $2^n$ and greater than or equal to the number of bits of the multi-bit data divided by $2^{n+1}$.

16. The system as claimed in claim 12, further comprising a memory for storing outputs from the balancing unit.

17. The system as claimed in claim 12, further comprising:
a balance reversing unit receiving the inversion indicator, the flag, multiple bit data other than the least significant bits and the least significant bits, the balance reversing unit restoring the least significant bits in accordance with a value of the inversion indicator, a value of the flag and values of the at least two least significant bits value of the flag, otherwise outputting the least significant bits unchanged.

18. The system as claimed in claim 12, further comprising:
a balance reversing unit including
a pattern detector receiving the inversion indicator, the at least two least significant bits and the flag, and outputting a trigger signal when a pattern of the inversion indicator, the flag and the at least two least significant bits indicates the least significant bits have been changed, and
a multiplexer receiving the least significant bits and the trigger signal, the multiplexer of the balance reversing unit restoring the least significant bits in response to the trigger signal, otherwise outputting the least significant bits unchanged, wherein:
the balance reversing unit further outputs the inversion indicator and multi-bit data other than the least significant bits.

19. The system as claimed in claim 18, further comprising a decoding unit receiving the inversion indicator and the multi-bit data, and restoring the multi-bit data.

20. A computer program or set of executable instructions stored on a readable medium and executed by a processor, to perform a method, the method comprising:
counting a number of data "0" in data bus inverted (DBI) data, including multi-bit data and an inversion indicator;
comparing the number of data "0" with a minimum number of data "0", the minimum number being greater than zero and less than or equal to a DBI maximum number of zeros;
setting a flag to "1" when the number is greater than or equal to the minimum number, and outputting the flag and the DBI data as encoded data;
setting the flag to "0" when the number is less than the minimum number;
comparing the number of data "0" plus one to the minimum number;
when the number of data "0" plus one is greater than or equal to the minimum number, outputting the flag and the DBI data as encoded data; and
when the number of data "0" plus one is less than the minimum number, altering values of at least two least significant bits in the multi-bit data, outputting the inversion indicator, the flag and the altered multi-bit data as encoded data.

* * * * *